US012660152B2

(12) United States Patent
Kim

(10) Patent No.: US 12,660,152 B2
(45) Date of Patent: Jun. 16, 2026

(54) MEMORY CELL AND SEMICONDUCTOR MEMORY DEVICE WITH THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/505,361

(22) Filed: Oct. 19, 2021

(65) Prior Publication Data

US 2022/0352169 A1     Nov. 3, 2022

(30) Foreign Application Priority Data

Apr. 30, 2021     (KR) ........................ 10-2021-0056537

(51) Int. Cl.
H10B 12/00     (2023.01)
H10D 30/67     (2025.01)
(52) U.S. Cl.
CPC ............. H10B 12/30 (2023.02); H10B 12/50 (2023.02); H10D 30/6741 (2025.01); H10D 30/6745 (2025.01); H10D 30/6755 (2025.01)
(58) Field of Classification Search
CPC ............. H01L 27/108; H01L 27/10805; H01L 27/1085; H01L 27/10873; H01L 27/10885; H01L 27/10891; H01L 27/10897; H01L 29/78672
See application file for complete search history.

(56) References Cited

U.S. PATENT DOCUMENTS

| | | | | |
|---|---|---|---|---|
| 11,538,808 B2 * | 12/2022 | Ma | ........................ | H10B 12/488 |
| 2005/0230729 A1 * | 10/2005 | Won | ........................ | H10B 12/033 |
| | | | | 257/296 |

(Continued)

FOREIGN PATENT DOCUMENTS

| | | |
|---|---|---|
| CN | 111627885 A | 9/2020 |
| CN | 112216696 A | 1/2021 |

(Continued)

OTHER PUBLICATIONS

Office Action for Korean Patent Application No. 10-2021-0056537 issued by the Korean Patent Office on Mar. 7, 2025.

(Continued)

*Primary Examiner* — Edward Chin
(74) *Attorney, Agent, or Firm* — IP & T GROUP LLP

(57) ABSTRACT

Present invention relates to a semiconductor memory device. A semiconductor memory device according to the present invention may comprise: a memory cell array including a plurality of memory cells over a substrate, the plurality of memory cells repeatedly arranged in horizontal direction and a vertical direction, the horizontal direction parallel to a surface of the substrate, the vertical direction perpendicular to the surface of the substrate, a bit line coupled to the memory cells arranged in the vertical direction, and a word line coupled to the memory cells arranged in the horizontal direction, wherein each of the memory cells comprises a capacitor comprising a storage node and a plate node, and the plate nodes of the capacitors are coupled to each other in the vertical direction and are spaced apart from each other in the horizontal direction.

20 Claims, 12 Drawing Sheets

(56)         References Cited

U.S. PATENT DOCUMENTS

| | | | | |
|---|---|---|---|---|
| 2006/0286802 A1* | 12/2006 | Yu | ..................... | H01L 21/28088 |
| | | | | 257/E21.334 |
| 2014/0103335 A1* | 4/2014 | Yamazaki | ............. | H10D 62/80 |
| | | | | 257/43 |
| 2014/0103491 A1* | 4/2014 | Kim | ....................... | H10D 1/716 |
| | | | | 257/532 |
| 2018/0212166 A1* | 7/2018 | May | ....................... | C09K 11/06 |
| 2018/0323199 A1* | 11/2018 | Roberts | ............... | H10D 64/518 |
| 2018/0323200 A1* | 11/2018 | Tang | ..................... | H10B 12/48 |
| 2019/0066751 A1* | 2/2019 | Matsubara | ............. | H10B 53/20 |
| 2020/0075851 A1* | 3/2020 | Karpov | ................. | H10B 63/24 |
| 2020/0176465 A1* | 6/2020 | Tang | ................... | H10B 12/036 |
| 2020/0219887 A1* | 7/2020 | Choi | ..................... | H10D 1/716 |
| 2020/0279601 A1* | 9/2020 | Kim | .................... | G11C 11/4097 |
| 2021/0036162 A1* | 2/2021 | Rigano | ............... | H10D 86/421 |
| 2021/0074825 A1* | 3/2021 | Sharma | ................ | H10N 70/20 |
| 2021/0265355 A1* | 8/2021 | Sharma | ............... | H10B 12/315 |
| 2022/0068929 A1* | 3/2022 | Karda | .............. | H01L 21/02189 |
| 2022/0122977 A1* | 4/2022 | Kim | ..................... | H10B 12/482 |
| 2022/0130834 A1* | 4/2022 | Lee | ..................... | G11C 11/4023 |
| 2022/0238700 A1* | 7/2022 | Huang | ................. | H10D 84/014 |
| 2022/0285353 A1* | 9/2022 | Cho | ........................ | H10B 12/05 |

FOREIGN PATENT DOCUMENTS

| | | | | | | |
|---|---|---|---|---|---|---|
| EP | | 3859780 A1 | * | 8/2021 | .......... | H10D 64/518 |
| KR | 10-2009-0105152 A | | | 10/2009 | | |
| KR | 10-2019-0060251 A | | | 6/2019 | | |
| KR | 10-2020-0105216 A | | | 9/2020 | | |
| KR | 10-2021-0007737 A | | | 1/2021 | | |
| KR | 20220146239 A | | * | 11/2022 | ......... | H01L 21/0271 |

OTHER PUBLICATIONS

Office Action for Chinese Patent Application No. 202210410093.X issued by the Chinese Patent Office on Feb. 6, 2026.

* cited by examiner

CAP

ACT

PL

A1

A1'

WL1   WL2

DWL

D1

D3

D2

MEMORY CELL AND SEMICONDUCTOR MEMORY DEVICE WITH THE SAME

CROSS-REFERENCE TO RELATED APPLICATIONS

The present application claims priority to Korean Patent Application No. 10-2021-0056537, filed on Apr. 30, 2021, which is incorporated herein by reference in its entirety.

BACKGROUND

1. Field

Various embodiments of the present invention relate to a semiconductor device and, more particularly, to a memory cell and a semiconductor memory device including the same.

2. Description of the Related Art

Integration degree of two-dimensional semiconductor memory devices is mainly determined by the area occupied by memory cells. Thus, the integration degree is highly affected by the level of a fine-pattern fabrication technology. The integration degree of two-dimensional semiconductor memory devices is still increasing, but the increase is limited because fabricating finer patterns requires highly expensive tools. Accordingly, three-dimensional (3D) semiconductor memory devices having three-dimensionally arranged memory cells are being suggested.

SUMMARY

Various embodiments of the present invention provide a highly integrated memory cell and a semiconductor memory device including the highly integrated memory cells.

A semiconductor memory device according to an embodiment of the present invention may comprise: a memory cell array including a plurality of memory cells over a substrate, the plurality of memory cells repeatedly arranged in horizontal direction and a vertical direction, the horizontal direction parallel to a surface of the substrate, the vertical direction perpendicular to the surface of the substrate; a bit line coupled to the memory cells arranged in the vertical direction; and a word line coupled to the memory cells arranged in the horizontal direction, wherein each of the memory cells comprises a capacitor comprising a storage node and a plate node; and wherein the plate nodes of the capacitors are coupled to each other in the vertical direction and are spaced apart from each other in the horizontal direction.

A semiconductor device according to an embodiment of the present invention may comprise: a capacitor array including a plurality of capacitors over a substrate, the plurality of capacitors repeatedly arranged in a horizontal direction and a vertical direction, the horizontal direction parallel to a surface of the substrate, the vertical direction perpendicular to the surface of the substrate, wherein each of the plurality of capacitors comprises a storage node, a plate node, and a dielectric layer between the storage node and the plate node; and wherein the plate nodes of the capacitors are coupled to each other in the vertical direction and are spaced apart from each other in the horizontal direction.

In the present invention, plate nodes of horizontally adjacent capacitors are spaced apart from each other. Therefore, capacitance may be increased while improving the stability of the storage nodes of the capacitor.

These and other features and advantages of the present invention will become better understood by the following detailed description and figures.

BRIEF DESCRIPTION OF THE DRAWINGS

FIG. 1 is a schematic perspective view illustrating a memory cell of a semiconductor memory device according to an embodiment of the present invention.

DETAILED DESCRIPTION

Figure 2A:
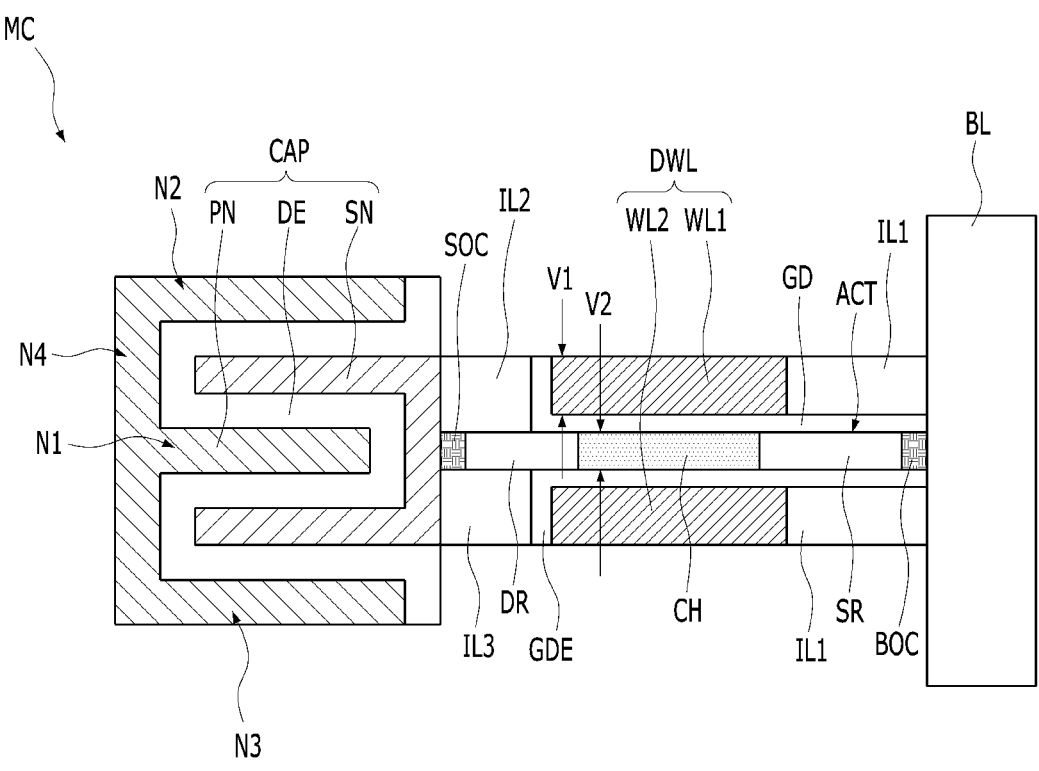
FIG. 2A is a cross-sectional view of the memory cell taken along line A1-A1' of FIG. 1.

Various embodiments described herein will be described with reference to cross-sectional views, plane views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

In an embodiment to be described later, memory cells are vertically stacked to increase memory cell density and reduce parasitic capacitance.

Figure 1:
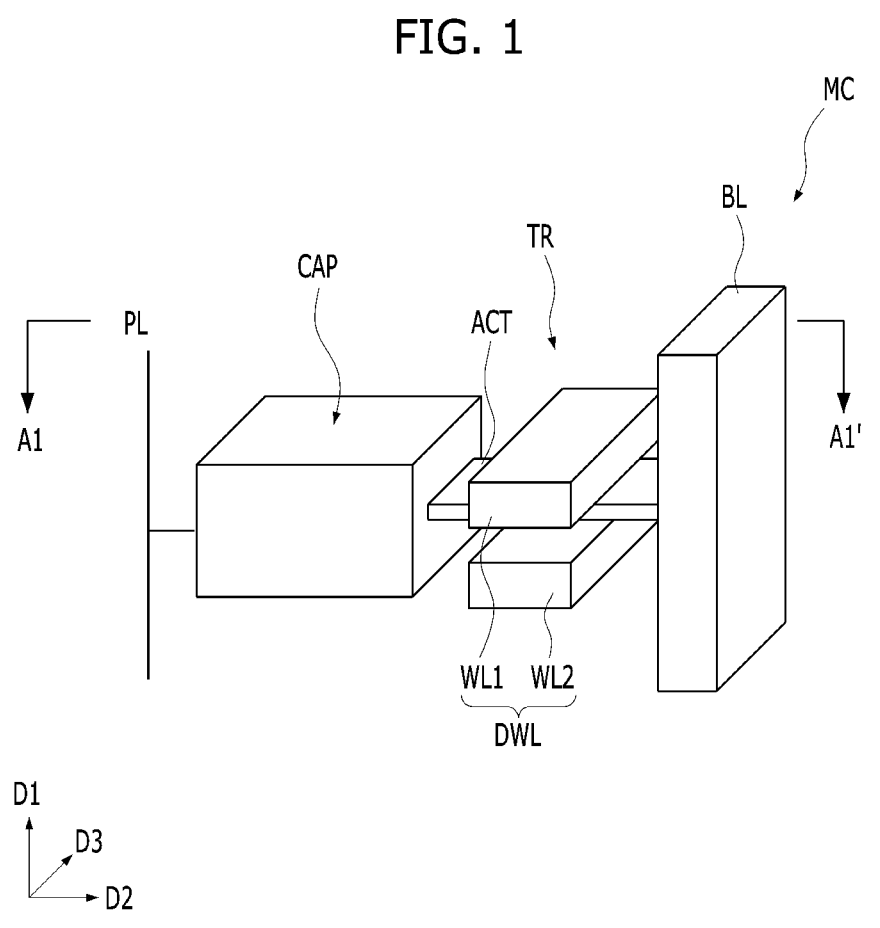
Figure 2A:
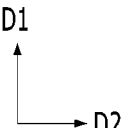
Figure 2B:
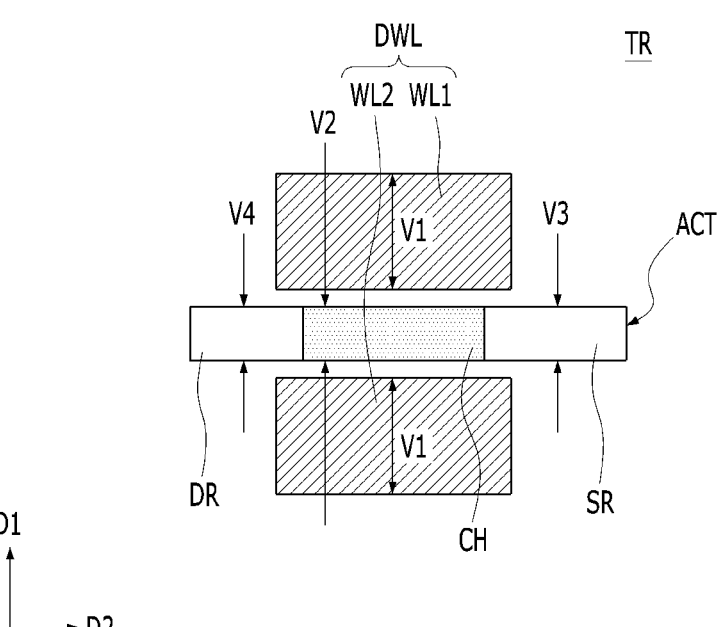
FIG. 2B is an enlarged view of a transistor TR.

FIG. 1 is a schematic perspective view illustrating a memory cell of a semiconductor memory device according to an embodiment of the present invention. FIG. 2A is a cross-sectional view of the memory cell taken along line A1-A1' of FIG. 1. FIG. 2B is an enlarged view of a transistor TR of FIG. 1.

Referring to FIGS. 1, 2A, and 2B, a memory cell MC of a semiconductor memory device according to an embodiment of the present invention may include a bit line BL, the transistor TR, and a capacitor CAP. The transistor TR may include an active layer ACT, a gate insulating layer GD, and a double word line DWL. The capacitor CAP may include a storage node SN, a dielectric layer DE, and a plate node PN. The bit line BL may have a pillar shape extending in a first direction D1. The active layer ACT may have a bar shape extending in a second direction D2 crossing the first direction D1. The double word line DWL may have a line shape extending in a third direction D3 crossing both the first direction D1 and the second direction D2. The plate node PN of the capacitor CAP may be connected to the plate line PL. The first, second, and third directions may be orthogonal to each other as shown in the embodiment of FIGS. 1, 2A and 2B, however, the present invention may not be limited in this way. The first direction D1 may be referred to as a vertical direction, the second and the third direction D3 may be referred to as a horizontal direction.

The bit line BL may be vertically oriented in the first direction D1. The bit line BL may be referred to as a vertically oriented bit line, a vertically extended bit line, or a pillar type bit line. The bit line BL may include a conductive material, such as a silicon-based material, a metal-based material, a combination thereof and the like. The bit line BL may include, for example, polysilicon, metal, metal nitride, metal silicide, or a combination thereof. The bit line BL may include, for example, polysilicon, titanium nitride, tungsten, or a combination thereof. In an embodiment, for example, the bit line BL may include polysilicon or titanium nitride (TiN) doped with N-type impurities. In another embodiment, for example, the bit line BL may include a stack of titanium nitride and tungsten (TiN/W).

The transistor TR may include an active layer ACT, a gate insulating layer GD, and a double word line DWL. The double word line DWL may extend in the third direction D3, and the active layer ACT may extend in the second direction D2. The active layer ACT may be laterally arranged from the bit line BL. The active layer ACT may include a thin-body channel CH, a first source/drain region SR between the thin-body channel CH and the bit line BL, and a second source/drain region DR between the thin-body channel CH and a capacitor CAP. The double word line DWL may include a first word line WL1 and a second word line WL2. The first word line WL1 and the second word line WL2 may face each other with the active layer ACT interposed therebetween. The gate insulating layer GD may be formed on upper (or top) and lower (or bottom) surfaces of the active layer ACT. The gate insulating layer GD may include an extension GDE extending to cover a side of the double word line DWL, for example, side surfaces of the double word line DWL which are adjacent to the second source/drain region DR.

The active layer ACT may include a semiconductor material or an oxide semiconductor material. For example, the active layer ACT may include silicon, germanium, silicon-germanium, or indium gallium zinc oxide (IGZO).

The first and second source/drain regions SR and DR may be doped with impurities of the same conductivity type. The first and second source/drain regions SR and DR may be doped with an N-type impurity or a P-type impurity. For example, the first and second source/drain regions SR and DR may include at least one impurity selected from the group consisting of Arsenic (As), Phosphorus (P), Boron (B), Indium (In), and a combination thereof. A first side of the first source/drain region SR may contact the bit line BL, and a second side of the first source/drain region SR may contact the thin-body channel CH. A first side of the second source/drain region DR may contact the storage node SN, and a second side of the second source/drain region DR may contact the thin-body channel CH. The second side of the first source/drain region SR and the second side of the second source/drain region DR may partially overlap sides of the first and second word lines WL1 and WL2. A horizontal length of the thin-body channel CH in the second direction D2 may be larger than the horizontal length of each of the first and second source/drain regions SR and DR in the second direction D2. A horizontal length of the thin-body channel CH in the second direction D2 may be smaller than a sum of the horizontal length of the first and second source/drain regions SR and DR in the second direction D2. In an embodiment (not shown), the horizontal length of the thin-body channel CH in the second direction D2 may be greater than the horizontal length of each of the first and second source/drain regions SR and DR in the second direction D2. A bit line side-ohmic contact BOC may be formed between the first source/drain region SR and the bit line BL. The bit line side-ohmic contact BOC may be formed when the metal of the bit line BL reacts with the silicon of the first source/drain region SR. The bit line side-ohmic contact BOC may include metal silicide, and may be formed on one edge of the active layer ACT, that is, a first side of the first source/drain region SR. A storage node side-ohmic contact SOC may be formed between the second source/drain region DR and the storage node SN. The storage node side-ohmic contact SOC may include metal silicide, and may be formed on the other edge of the active layer ACT, that is, on the first side of the second source/drain region DR. The storage node side-ohmic contact SOC may be formed when the metal of the storage node SN reacts with the silicon of the second source/drain region DR.

The gate insulating layer GD may include silicon oxide, silicon nitride, metal oxide, metal oxynitride, metal silicate, a high-k material, a ferroelectric material, an anti-ferroelectric material, or a combination thereof. The gate insulating layer GD may include silicon oxide ($SiO_2$), trisilicon tetranitride ($Si_3N_4$), hafnium oxide ($HfO_2$), aluminum oxide ($Al_2O_3$), zirconium oxide ($ZrO_2$), aluminum oxynitride (AlON), hafnium oxynitride (HfON), hafnium silicon oxide (HfSiO) hafnium silicon oxynitride HfSiON, or a combination thereof.

The double word line DWL may include a metal, a metal nitride, a metal silicide, a metal mixture, a metal alloy, or a semiconductor material. The double word line DWL may include, for example, titanium nitride, tungsten, polysilicon, or a combination thereof. In an embodiment, for example, the double word line DWL may include a TiN/W stack in which titanium nitride and tungsten are sequentially stacked. The double word line DWL may include an N-type work-function material or a P-type work-function material. The N-type work-function material may have a low work-function of 4.5 eV or less, and the P-type work-function material may have a high work-function of 4.5 eV or more.

The capacitor CAP may be laterally disposed from the transistor TR in the second direction D2. The capacitor CAP may include the storage node SN laterally extending from the active layer ACT in the second direction D2. The capacitor CAP may further include a dielectric layer DE and a plate node PN over the storage node SN. The storage node SN, the dielectric layer DE, and the plate node PN may be laterally arranged in the second direction D2. The storage node SN may have a horizontally oriented cylinder shape. The dielectric layer DE may conformally cover the cylinder inner wall and the cylinder outer wall of the storage node SN. The plate node PN may have a shape extending to a cylinder inner wall and a cylinder outer wall of the storage node SN over the dielectric layer DE. The plate node PN may be connected to the plate line PL. The storage node SN may be electrically connected to the second source/drain region DR via the storage node-side ohmic contact SOC.

The storage node SN may have a three-dimensional structure, and the three-dimensional structure may be horizontally oriented to the second direction D2. As an example of the three-dimensional structure, the storage node SN may have a cylinder shape. In another embodiment, the storage node SN may have a pillar shape or a pylinder shape. The pylinder shape may refer to a structure in which a pillar shape and a cylinder shape are merged. The top surface of the storage node SN may be positioned at the same level as the top surface of the first word line WL1. The bottom surface of the storage node SN may be positioned at the same level as the bottom surface of the second word line WL2.

The plate node PN may include an inner node N1 and outer nodes N2, N3, and N4. The inner node N1 and the outer nodes N2, N3, and N4 may be interconnected. The inner node N1 may be located inside the cylinder of the storage node SN. The outer nodes N2 and N3 may be located outside the cylinder of the storage node SN with the dielectric layer DE interposed therebetween. The outer node N4 may interconnect the inner node N1 and the outer nodes N2 and N3. The outer nodes N2 and N3 may be positioned to surround the cylinder outer wall of the storage node SN. The outer node N4 may be connected to the plate line PL. The outer node N4 together with the inner nodes N1, N2, and N3 may form an "E" shape.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium, (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, the silicon germanium (SiGe) may be a gap-fill material filling the inside of the cylinder of the storage node SN, the titanium nitride (TiN) may be used as the plate node PN of the capacitor CAP, and tungsten nitride (WN) may be a low-resistivity material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the aforementioned high-k material.

The dielectric layer DE may be formed of zirconium (Zr)-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. In another embodiment, the dielectric layer DE may be formed of hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a band gap larger than that of the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high bandgap material may be thinner than the high-k material. In another embodiment, the dielectric layer DE may include a laminated structure in which a high-k material and a high-bandgap material are alternately stacked. For example, the dielectric layer DE may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structures described above, aluminum oxide ($Al_2O_3$) may be thinner than zirconium oxide and hafnium oxide.

In another embodiment, the dielectric layer DE may include a stack structure, a laminate structure, or a mutual mixing structure including zirconium oxide, hafnium oxide, or aluminum oxide.

In another embodiment, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with other data storage materials. For example, the data storage material may include a phase change material, a magnetic tunnel junction (MTJ), or a variable resistor material.

An oxide-based dielectric layer IL1 may be formed between the bit line BL and the double word line DWL. The oxide-based dielectric layer IL1 may include silicon oxide.

A nitride-based dielectric layer IL2 and a carbon-containing dielectric layer IL3 may be formed between the double word line DWL and the storage node SN. The nitride-based dielectric layer IL2 may include silicon nitride. The carbon-containing dielectric layer IL3 may include silicon carbon nitride (SiCN), silicon carbon oxide (SiCO), or a combination thereof. A nitride-based dielectric layer IL2 may be formed between the first word line WL1 and the storage node SN. The carbon-containing dielectric layer IL3 may be formed between the second word line WL2 and the storage node SN. The carbon-containing dielectric layer IL3 may have an etch selectivity with respect to the oxide-based dielectric layer IL1 and the nitride-based dielectric layer IL2. That is, the carbon-containing dielectric layer IL3 may be used as an etch stop layer.

Referring back to FIGS. 2A and 2B, the transistor TR is a cell transistor and may have a double word line DWL. In the double word line DWL, the first word line WL1 and the second word line WL2 may have the same electric potential. For example, the first word line WL1 and the second word line WL2 may form a pair that drives one memory cell MC. The same word line driving voltage may be applied to the first word line WL1 and the second word line WL2. As such, the memory cell MC according to an embodiment of the present invention may have a double word line DWL in which the first and second word lines WL1 and WL2 are disposed adjacent to one thin-body channel CH.

In another embodiment, the first word line WL1 and the second word line WL2 may have different electric potentials. For example, a word line driving voltage may be applied to the first word line WL1, and a ground voltage may be applied to the second word line WL2. The second word line WL2 may be referred to as a back word line or a shield word line. In another embodiment, a ground voltage may be applied to the first word line WL1, and a word line driving voltage may be applied to the second word line WL2.

The first and second word lines WL1 and WL2 may each have a first thickness V1 as measured parallel to the first direction D1, and the active layer ACT may have a second thickness V2 as measured parallel to the first direction D1. The first thickness V1 and the second thickness V2 may also be referred to as a vertical thickness. The second thickness V2 may be smaller than the first thickness V1. The active layer ACT may have a thickness smaller than that of the first and second word lines WL1 and WL2. The active layer ACT may be referred to as a thin-body active layer.

The thin-body channel CH may have the second thickness V2 as measured parallel to the first direction D1. The second thickness V2 of the thin-body channel CH may be smaller than the first and second word lines WL1 and WL2. The second thickness V2 of the thin-body channel CH may be greater than a thickness of the gate insulating layer GD. The thin-body channel CH and the gate insulating layer GD may have the same thickness.

The first source/drain region SR may have a third thickness V3 as measured parallel to the first direction D1, and the second source/drain region DR may have a fourth thickness V4 as measured parallel to the first direction D1. The third thickness V3 of the first source/drain region SR, the fourth thickness V4 of the second source/drain region DR, and the second thickness V2 of the thin-body channel CH may be the same. The third thickness V3 of the first source/drain region SR and the fourth thickness V4 of the second source/drain region Dr may be smaller than the first thickness V1 of the first and second word lines WL1 and WL2.

The second thickness V2 of the thin-body channel CH may be 10 nm or less (1 to 10 nm). The third thickness V3 of the first source/drain region SR and the fourth thickness V4 of the second source/drain region DR may be 10 nm or less. In another embodiment, the third thickness V3 of the first source/drain region SR and the fourth thickness V4 of the second source/drain region DR may be smaller than the first thickness V1 of the first and second word lines WL1 and WL2 and greater than the second thickness V2 of the thin-body channel CH.

An upper surface and a lower surface of the active layer ACT may have a flat surface. That is, an upper surface and a lower surface of the active layer ACT may be parallel to each other in the second direction D2.

Figure 3A:
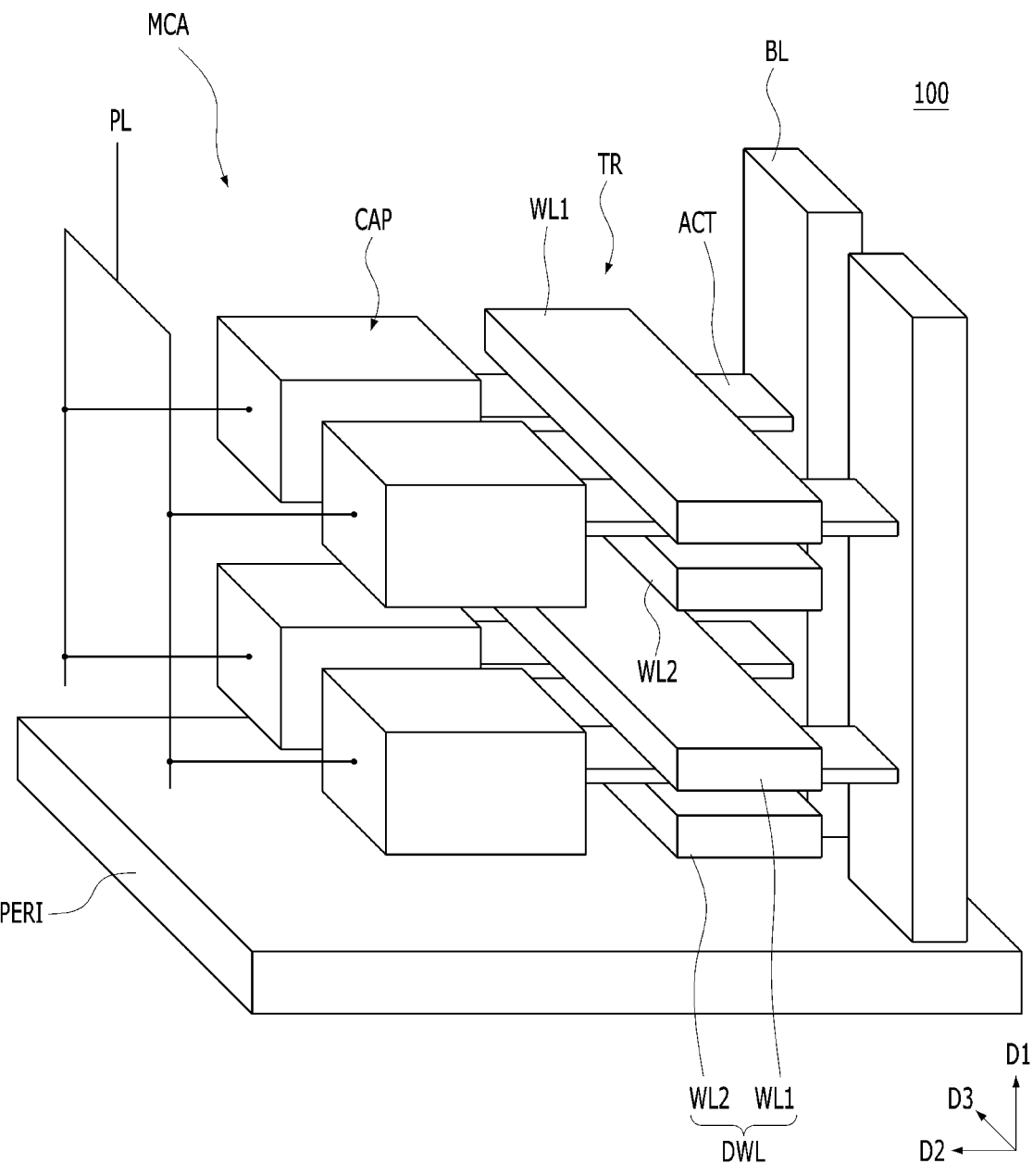
FIG. 3A is a schematic perspective view illustrating a semiconductor memory device according to an embodiment of the present invention.
Figure 3B:
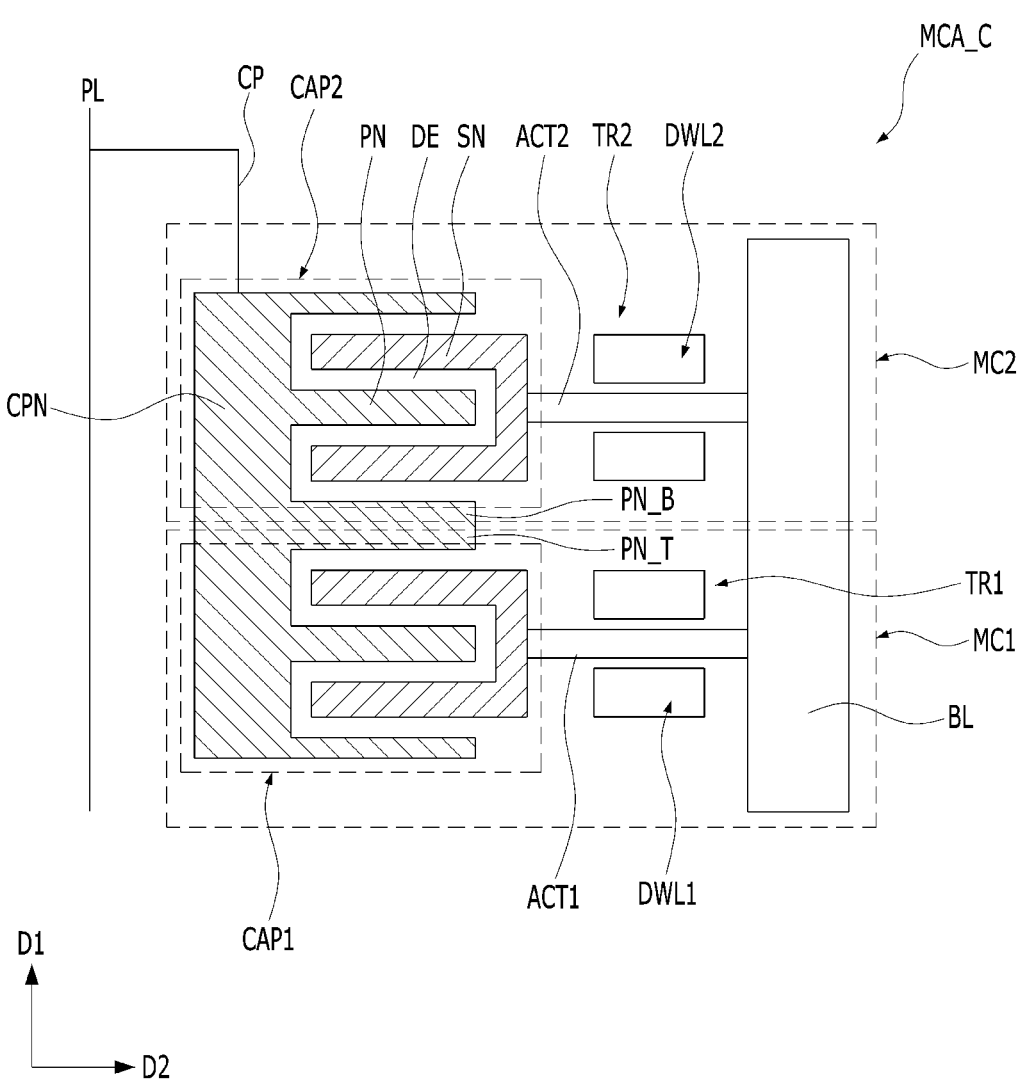
FIG. 3B is a cross-sectional view of a vertical memory cell array of a semiconductor memory device.
Figure 3C:
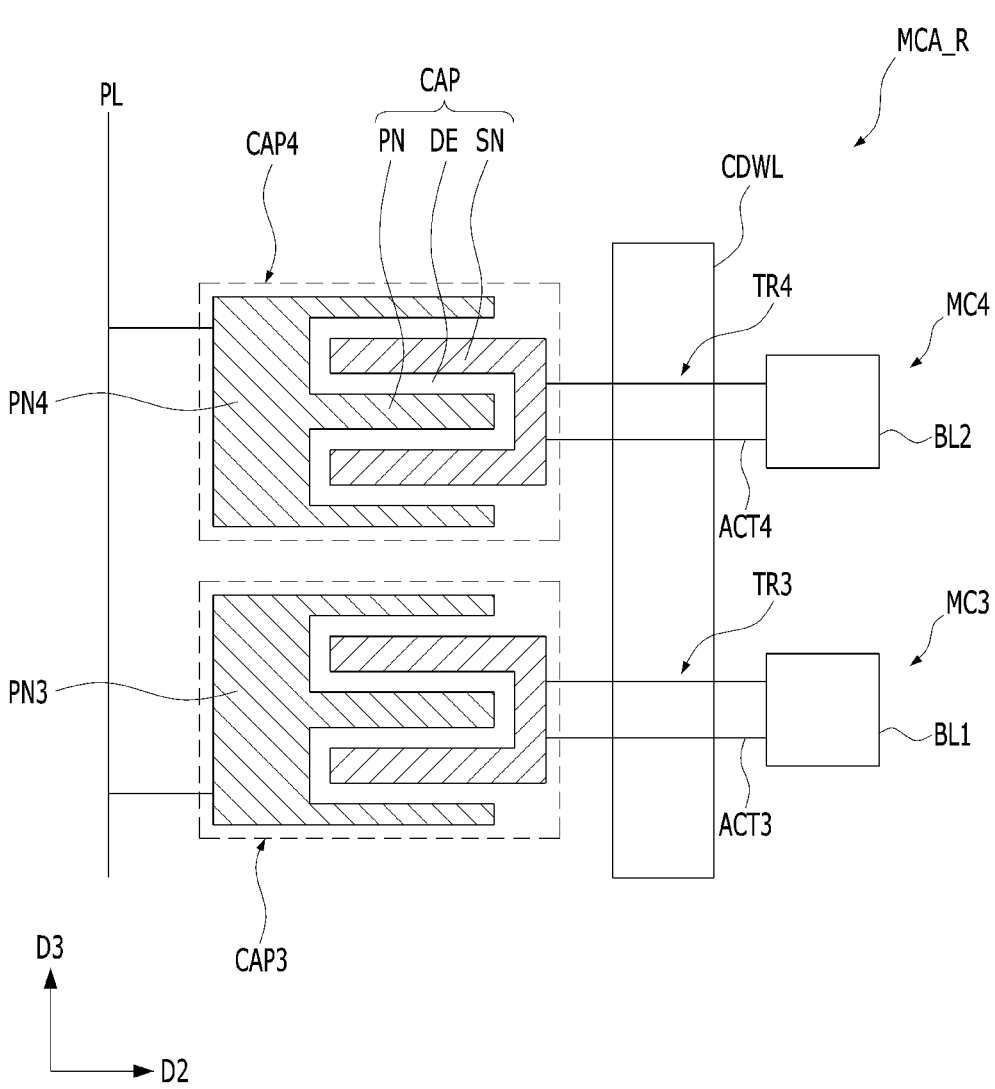
FIG. 3C is a plan view illustrating a horizontal memory cell array of a semiconductor memory device.

FIG. 3A is a schematic perspective view of a semiconductor memory device according to an embodiment of the present invention. FIG. 3B is a cross-sectional view of a vertical memory cell array of a semiconductor memory device, and FIG. 3C is a plan view of a horizontal memory cell array of the semiconductor memory device.

Referring to FIG. 3A, the semiconductor memory device 100 may include a memory cell array MCA. The memory cells MC of FIGS. 1 and 2 may be arranged in the first to third directions D1, D2, and D3 to form a multi-layered memory cell array MCA. FIG. 3A illustrates a three-dimensional memory cell array composed of four memory cells. Each of the memory cells may include a capacitor CAP. In the memory cell array MCA, two double word lines DWL may be vertically stacked in the first direction D1. Each double word line DWL may include a pair of the first word line WL1 and the second word line WL2. Between the first word line WL1 and the second word line WL2, a plurality of active layers ACT may be spaced apart from and laterally arranged with each other in the third direction D3. Referring to FIG. 2A, the thin-body channel CH of the active layer ACT may be positioned between the first word line WL1 and the second word line WL2.

The memory cell array MCA may include a three-dimensional array of memory cells. Referring to FIGS. 3B and 3C, the memory cell array MCA may include a vertical memory cell array MCA_C and a horizontal memory array MCA_R.

The semiconductor memory device 100 may further include a substrate PERI, and the substrate PERI may include a peripheral circuit. The memory cell array MCA including a plurality of memory cells over the substrate PERI, the plurality of memory cells repeatedly arranged in horizontal direction (i.e., the third direction D3) and a vertical direction (i.e., the first direction D1), the horizontal direction parallel to a surface of the substrate PERI, the vertical direction perpendicular to the surface of the substrate PERI. Hereinafter, the substrate PERI will be referred to as a peripheral circuit PERI. The bit line BL of the memory cell array MCA may be oriented perpendicular to the upper surface of the peripheral circuit PERI, and the double word line DWL may be oriented parallel to the upper surface of the peripheral circuit PERI. Referring to FIGS. 3B and 3C, the memory cell array MCA including memory cells MC1, MC2, MC3 and MC4 over the peripheral circuit PERI. The memory cells MC3 and MC4 arranged in a horizontal direction (i.e., the third direction D3), and the memory cells MC1 and MC2 arranged in a vertical direction (i.e., the first direction D1). The horizontal direction is parallel to a surface of the peripheral circuit PERI, and the vertical direction is perpendicular to the surface of the peripheral circuit PERI.

As shown in FIG. 3B, the vertical memory cell array MCA_C may include an array of memory cells MC1 and MC2 vertically arranged in the first direction D1. As shown in FIG. 3C, the horizontal memory cell array MCA_R may include an array of memory cells MC3 and MC4 that are horizontally arranged along the third direction D3. The vertical memory cell array MCA_C may be referred to as a column array of memory cells MC1 and MC2, and the horizontal memory cell array MCA_R may be referred to as a row array of memory cells MC3 and MC4. The bit line BL may be vertically oriented to be connected to the vertical memory cell array MCA_C, and the double word line DWL may be horizontally oriented to be connected to the horizontal memory cell array MCA_R. A bit line connected to the vertical memory cell array MCA_C may be referred to as a common bit line BL, and adjacent vertical memory cell arrays MCA_C disposed in the third direction D3 may be connected to different common bit lines BL. The double word line DWL connected to the horizontal memory cell array MCA_R may be referred to as a common double word line CDWL, and adjacent horizontal memory cell arrays MCA_R disposed in the first direction D1 may be connected to different common double word lines CDWL.

When the vertical memory cell array MCA_C is described with reference to FIG. 3B, the first memory cell MC1 and the second memory cell MC2 may be vertically stacked in the first direction D1.

The first memory cell MC1 may include a first transistor TR1 and a first capacitor CAP1. The first transistor TR1 may include a first active layer ACT1 and a first double word line DWL1. One side of the first active layer ACT1 may be connected to the bit line BL, and the other side of the first active layer ACT1 may be connected to the first capacitor CAP1.

The second memory cell MC2 may include a second transistor TR2 and a second capacitor CAP2. The second transistor TR2 may include a second active layer ACT2 and a second double word line DWL2. One side of the second active layer ACT2 may be connected to the bit line BL, and the other side of the second active layer ACT2 may be connected to the second capacitor CAP2.

The first capacitor CAP1 and the second capacitor CAP2 may each include a storage node SN, a dielectric layer DE, and a plate node PN. The plate node PN of the first capacitor CAP1 and the plate node PN of the second capacitor CAP2 may be commonly connected to the plate line PL. The plate node PN of the first capacitor CAP1 and the plate node PN of the second capacitor CAP2 may be interconnected. For example, the plate node PN of the first capacitor CAP1 and the plate node PN of the second capacitor CAP2 may be interconnected through a common plate node CPN. The uppermost plate node PN_T of the first capacitor CAP1 and the lowermost plate node PN_B of the second capacitor CAP2 may be interconnected to each other as a single unit. The common plate node CPN may be connected to the plate line PL through the contact plug CP.

The horizontal memory cell array MCA_R will be described with reference to FIG. 3C. The horizontal memory cell array MCA_R may have a third memory cell MC3 and a fourth memory cell MC4 which are laterally disposed in the third direction D3.

The third memory cell MC3 may include a third transistor TR3 and a third capacitor CAP3. The third transistor TR3 may include a third active layer ACT3 and a common double word line CDWL. One side of the third active layer ACT3 may be connected to the first bit line BL1, and the other side of the third active layer ACT3 may be connected to the third capacitor CAP3.

The fourth memory cell MC4 may include a fourth transistor TR4 and a fourth capacitor CAP4. The fourth transistor TR4 may include a fourth active layer ACT4 and the common double word line CDWL. One side of the fourth active layer ACT4 may be connected to the second bit line BL2, and the other side of the fourth active layer ACT4 may be connected to the fourth capacitor CAP4.

The third capacitor CAP3 and the fourth capacitor CAP4 may each include a storage node SN, a dielectric layer DE, and a plate node PN. The plate node PN3 of the third capacitor CAP3 and the plate node PN4 of the fourth capacitor CAP4 may be separated from each other. For example, the plate node PN3 of the third capacitor CAP3 and the plate node PN4 of the fourth capacitor CAP4 may be spaced apart from each other and may be connected to the plate line PL.

Figure 4:
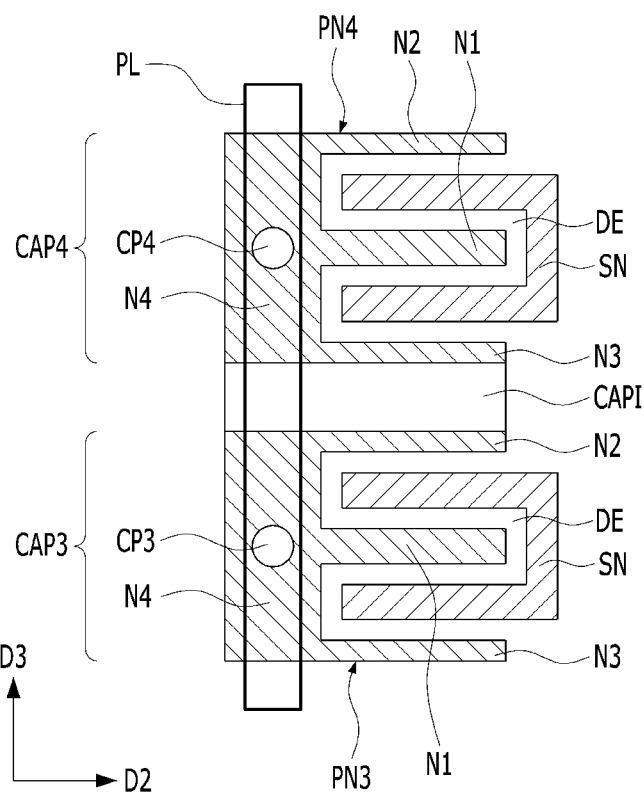
FIG. 4 is a detailed view of the capacitors shown in FIG. 3C.

FIG. 4 is a detailed view of the capacitors of FIG. 3C.

Referring to FIG. 4, a capacitor isolation layer CAPI may be disposed between the capacitors CAP3 and CAP4 which are horizontally adjacent in the third direction D3. The plate node PN3 of the third capacitor CAP3 and the plate node PN4 of the fourth capacitor CAP4 may be spaced apart from each other by the capacitor isolation layer CAPI. The capacitor isolation layer CAPI may include a dielectric material such as silicon oxide.

The plate node PN3 of the third capacitor CAP3 may be connected to the plate line PL through a contact plug CP3. The plate node PN4 of the fourth capacitor CAP4 may be connected to the plate line PL through a contact plug CP4.

The plate nodes PN3 and PN4 of the respective capacitors CAP3 and CAP4 adjacent to each other in the third direction D3 may each include an inner node N1 disposed inside a corresponding storage node SN, outer nodes N2 and N3 disposed between the storage nodes SN, and a body node N4 connected to the outer nodes N2 and N3 and the inner node N1. The inner node N1 may be thicker than the outer nodes N2 and N3. The body nodes N4 of the plate nodes PN3 and PN4 may be connected to the plate line PL through the contact plugs CP3 and CP4, respectively. The plate line PL and the contact plugs CP3 and CP4 may include a metal-based material. The plate nodes PN3 and PN4 may be connected by contact plugs CP3 and CP4, respectively. The body nodes N4 of the plate nodes PN3 and PN4 may be spaced apart from each other by the capacitor isolation layer CAPI. The outer node N2 of the plate node PN3 and the outer node N3 of the plate node PN4 may be spaced apart from each other by the capacitor isolation layer CAPI. The outer node N2 of the plate node PN3 and the outer node N3 of the plate node PN4 may be positioned between the storage node SN of the third capacitor CAP3 and the storage node SN of the fourth capacitor CAP4. The outer node N2 of the plate node PN3 and the outer node N3 of the plate node PN4 may face each other and be parallel to each other.

Referring to FIGS. 3B to 4, the plate nodes PN of the capacitors CAP1 and CAP2 stacked along the first direction D1 (i.e., the vertical direction) may be coupled to each other, and the plate nodes PN3 and PN4 of the capacitors CAP3 and CAP4 arranged in the third direction D3 (i.e., the horizontal direction) may be separated from each other. The plate nodes of the capacitors CAP1 and CAP2 stacked along the first direction D1 and the plate nodes of the capacitors CAP3 and CAP4 arranged in the third direction D3 may share the plate line PL.

Figure 5A:
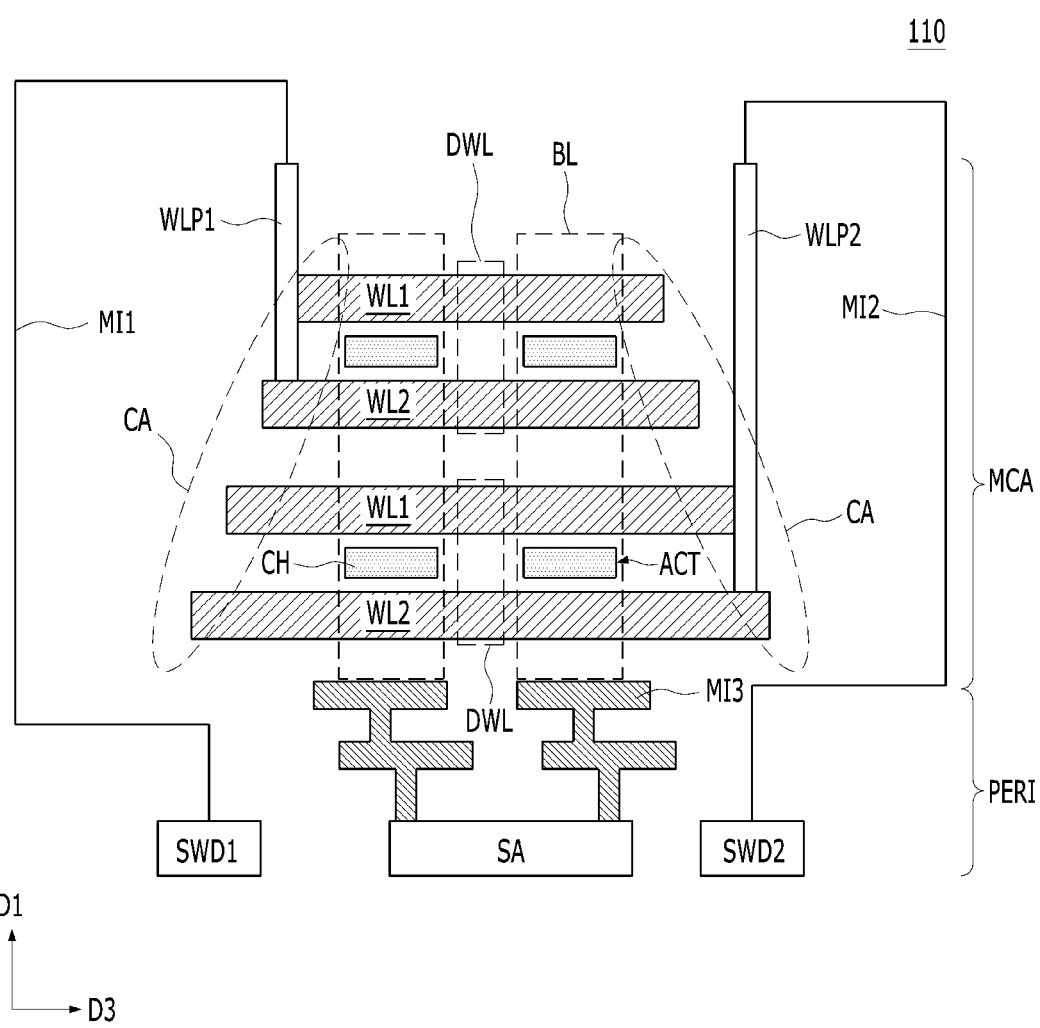
FIGS. 5A and 5B are schematic cross-sectional views of a memory cell array of a semiconductor memory device according to other embodiments of the present invention.
Figure 5B:
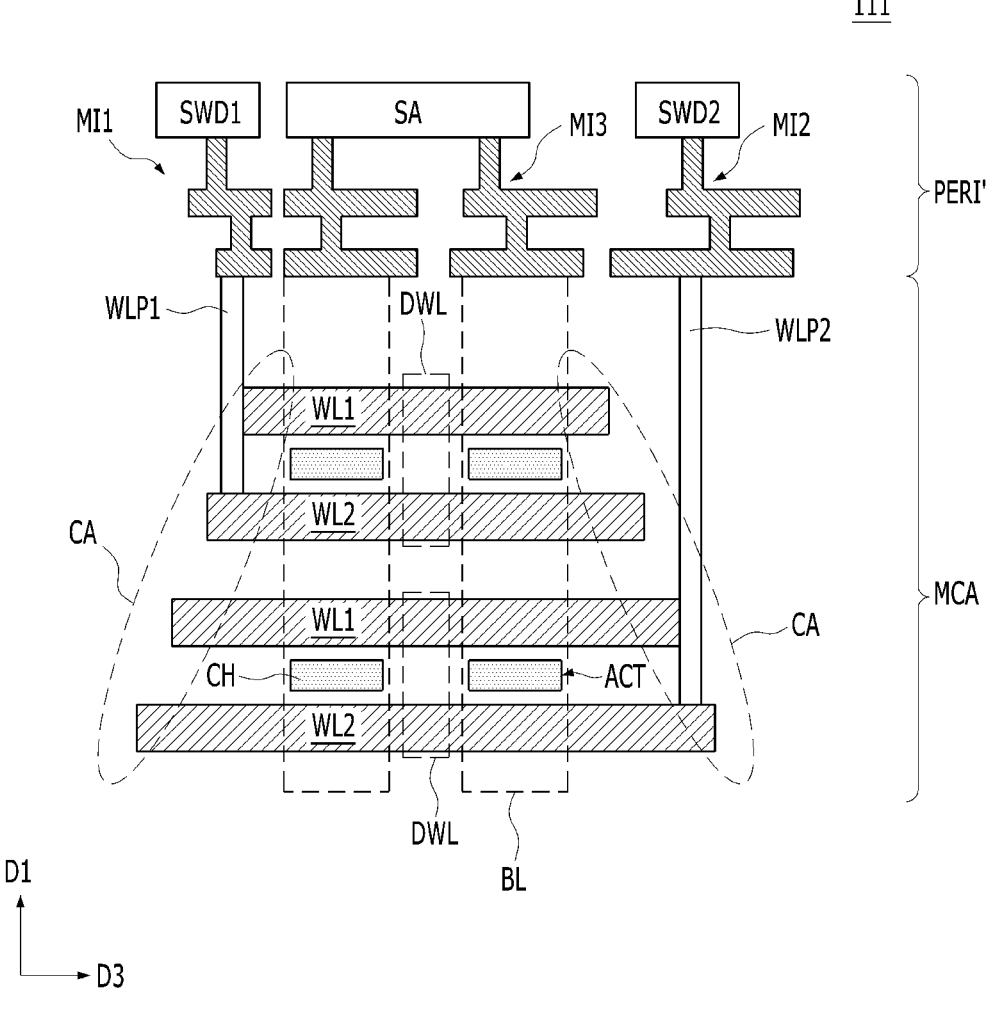

FIGS. 5A and 5B are schematic cross-sectional views of a memory cell array of a semiconductor memory device according to other embodiments of the present invention. FIG. 5A shows the semiconductor memory device 110 having a COP (cell over PERI) structure. FIG. 5B shows a semiconductor memory device 111 having a POC (PERI over cell) structure. In FIGS. 5A and 5B, detailed descriptions of duplicate components with those of FIGS. 1 to 4 will be omitted.

Referring to FIG. 5A, the semiconductor memory device 110 may include a memory cell array MCA and a peripheral circuit PERI. The peripheral circuit PERI may be disposed at a lower level than the memory cell array MCA. This may be referred to as a COP structure.

Referring to FIG. 5B, the semiconductor memory device 111 may include a memory cell array MCA and a peripheral circuit PERI'. The peripheral circuit PERI' may be disposed at a higher level than the memory cell array MCA. This may be referred to as a POC structure.

In FIGS. 5A and 5B, both edge portions of each of the double word lines DWL may have a step shape, and the step shape may define the contact portions CA. Each of the first word lines WL1 and the second word lines WL2 may include both edge portions, or the contact portions CA. Each of the contact portions CA may have a step shape.

A plurality of word line pads WLP1 and WLP2 may be connected to corresponding contact portions CA. The first word line pad WLP1 may be connected to the contact portions CA of the first word line WL1 and the second word line WL2 disposed at an upper level. The second word line pad WLP2 may be connected to the contact portions CA of the first word line WL1 and the second word line WL2 disposed at a lower level. The first word line WL1 and the second word line WL2 at the upper level may be interconnected by the first word line pad WLP1. The first word line WL1 and the second word line WL2 at the lower level may be interconnected by the second word line pad WLP2.

The peripheral circuits PERI and PERI' may include at least one control circuit for driving the memory cell array MCA. At least one control circuit of the peripheral circuits PERI and PERI' may include an N-channel transistor, a P-channel transistor, a CMOS circuit, or a combination thereof. At least one control circuit of the peripheral circuits PERI and PERI' may include an address decoder circuit, a read circuit, a write circuit, and the like. At least one control circuit of the peripheral circuits PERI and PERI' may include a planar channel transistor, a recess channel transistor, a buried gate transistor, a fin field-effect transistor (FinFET), and the like.

For example, the peripheral circuits PERI and PERI' may include sub-word line drivers SWD1 and SWD2 and a sense amplifier SA. The first and second word lines WL1 and WL2 at the upper level may be connected to the first sub-word line driver SWD1 through the first word line pad WLP1 and the first metal interconnections MI1. The first and second word lines WL1 and WL2 at the lower level may be connected to the second sub-word line driver SWD2 through the second word line pad WLP2 and the second metal interconnections MI2. The bit lines BL may be connected to the sense amplifier SA through the third metal interconnections MI3. The third metal interconnections MI3 may have a multi-level metal (MLM) structure including a plurality of vias and a plurality of metal lines.

Figure 6:
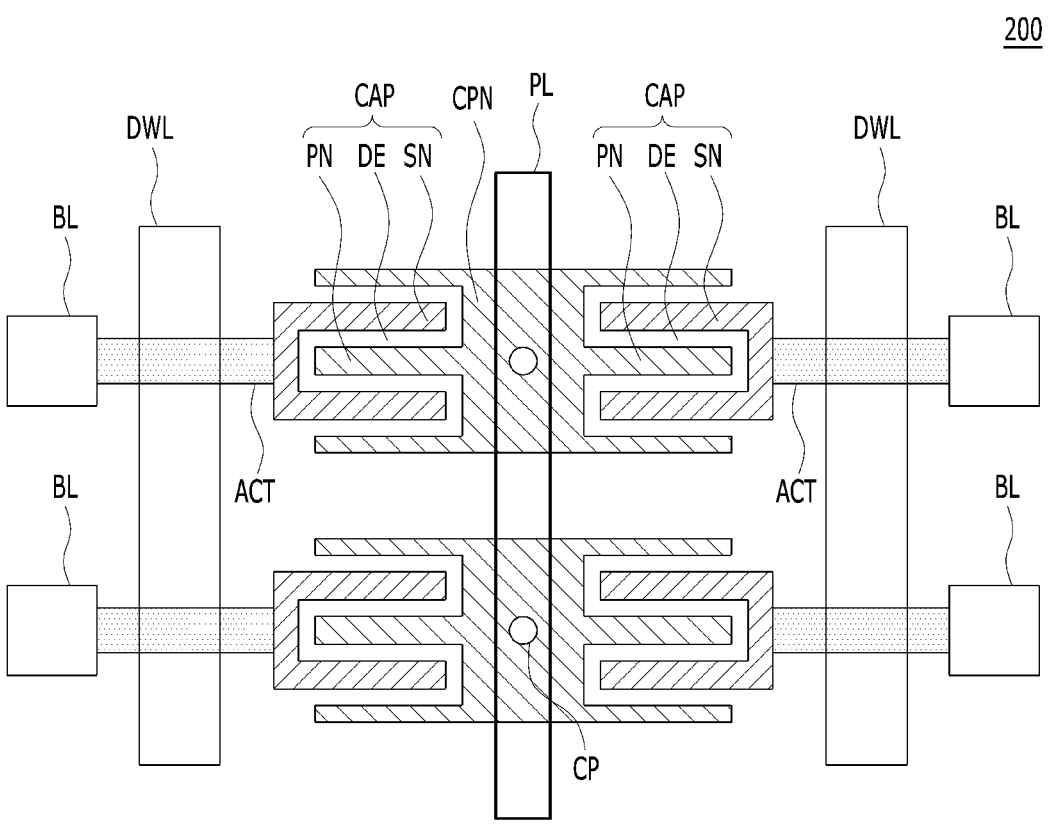
FIG. 6 is a plan view illustrating a semiconductor memory device according to another embodiment of the present invention.
Figure 6:
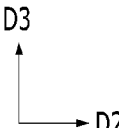

FIG. 6 is a plan view of a semiconductor memory device according to another embodiment of the present invention. In FIG. 6, detailed descriptions of duplicate components with those of FIGS. 1 to 5B will be omitted.

Referring to FIG. 6, the semiconductor memory device 200 may include a memory cell array having a mirror type structure. The semiconductor memory device 200 shows a horizontal memory cell array, that is, a row array of memory cells. The semiconductor memory device 200 may include a row array of horizontally adjacent capacitors CAP arranged in the second direction D2 and the third direction D3. The capacitors CAP of the row array may include storage nodes SN spaced apart from each other. The capacitors CAP of the row array adjacent in the third direction D3 may include plate nodes PN spaced apart from each other. As referenced in FIG. 4, the capacitor isolation layer CAPI may be disposed between the plate nodes PN of the capacitors CAP adjacent to each other in the third direction D3. Each of the capacitors CAP may include a cylindrical storage node SN.

In the semiconductor memory device 200, a plurality of memory cells may be disposed adjacent to each other in the second direction D2, and a plurality of memory cells may be disposed adjacent to each other in the third direction D3. The memory cells horizontally adjacent in the second direction D2 may share one common plate node CPN. The memory cells horizontally adjacent in the third direction D3 may share one plate line PL. The memory cells horizontally adjacent in the third direction D3 may share one double word line DWL. The memory cells horizontally adjacent in the second direction D2 may be connected to different double word lines DWL. The memory cells horizontally adjacent to each other in the third direction D3 and the second direction D2 may be connected to different bit lines BL.

Each of the memory cells may include a capacitor CAP. Each capacitor CAP may include a cylindrical storage node SN, a dielectric layer DE, and a plate node PN. The plate nodes PN of the capacitors CAP adjacent in the second direction D2 may be interconnected through a common plate node CPN. The plate nodes PN of the capacitors CAP adjacent in the third direction D3 may be spaced apart from each other, but each may be connected to one plate line PL through a corresponding contact plug CP.

Figure 7:
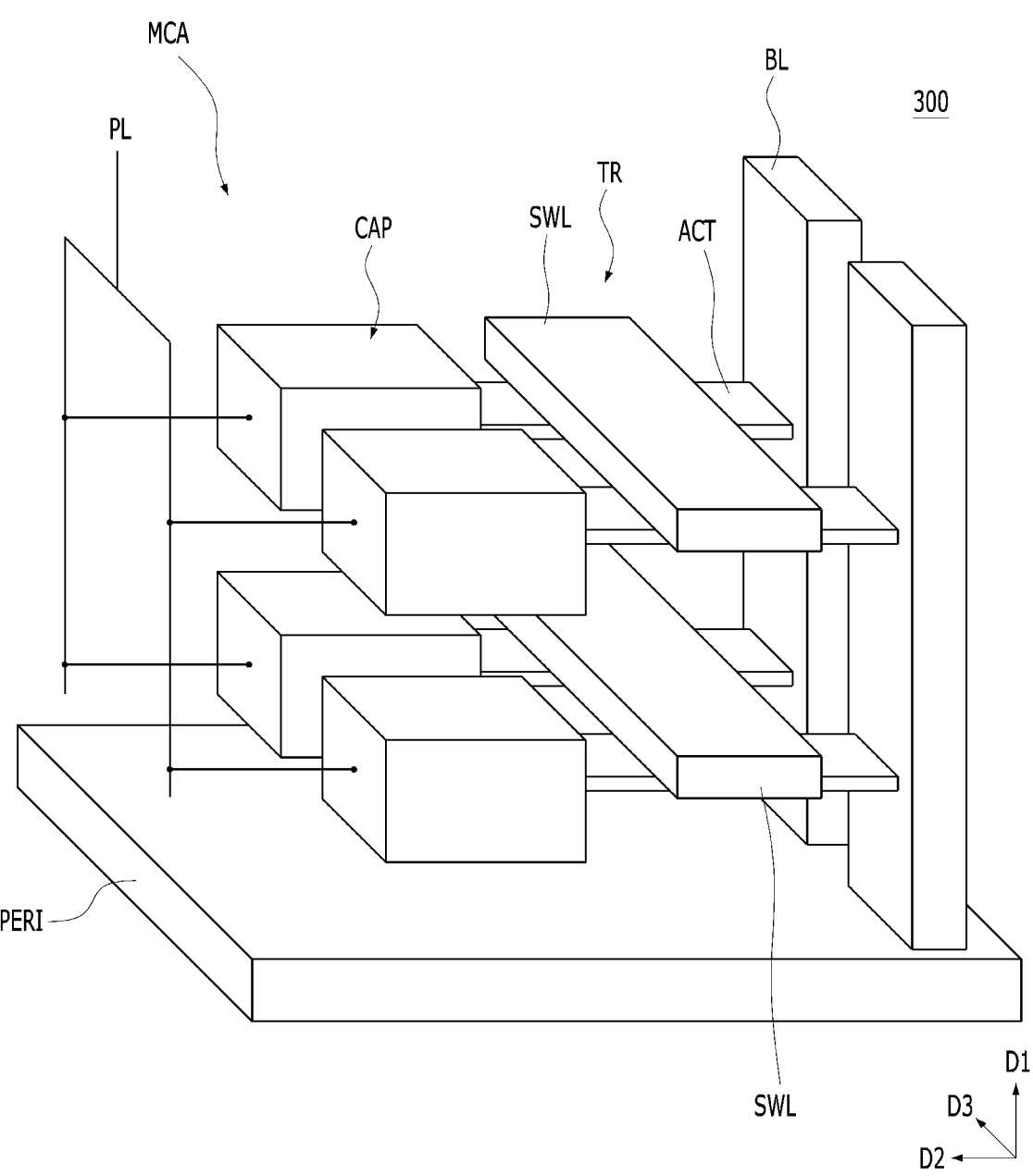
FIG. 7 is a schematic perspective view illustrating a semiconductor memory device according to another embodiment of the present invention.

FIG. 7 is a schematic perspective view of a semiconductor memory device according to another embodiment of the present invention. In FIG. 7, detailed descriptions of duplicate components with those of FIG. 3A will be omitted.

Referring to FIG. 7, the semiconductor memory device 300 may include a memory cell array MCA. The memory cell array MCA may be an array of a plurality of memory cells.

Each memory cell of the memory cell array MCA may include a bit line BL, a transistor TR, and a capacitor CAP. The transistor TR may include an active layer ACT and a single word line SWL. The bit line BL may have a pillar shape extending in the first direction D1. The active layer ACT may have a bar shape extending in the second direction D2 crossing the first direction D1. The single word line SWL may have a line shape extending in the third direction D3 crossing both the first direction D1 and the second direction D2. The capacitors CAP may be connected to a plate line PL.

The single word line SWL may be disposed over the upper surface of the active layer ACT. In another embodiment, the single word line SWL may be disposed below the lower surface of the active layer ACT.

Figure 8:
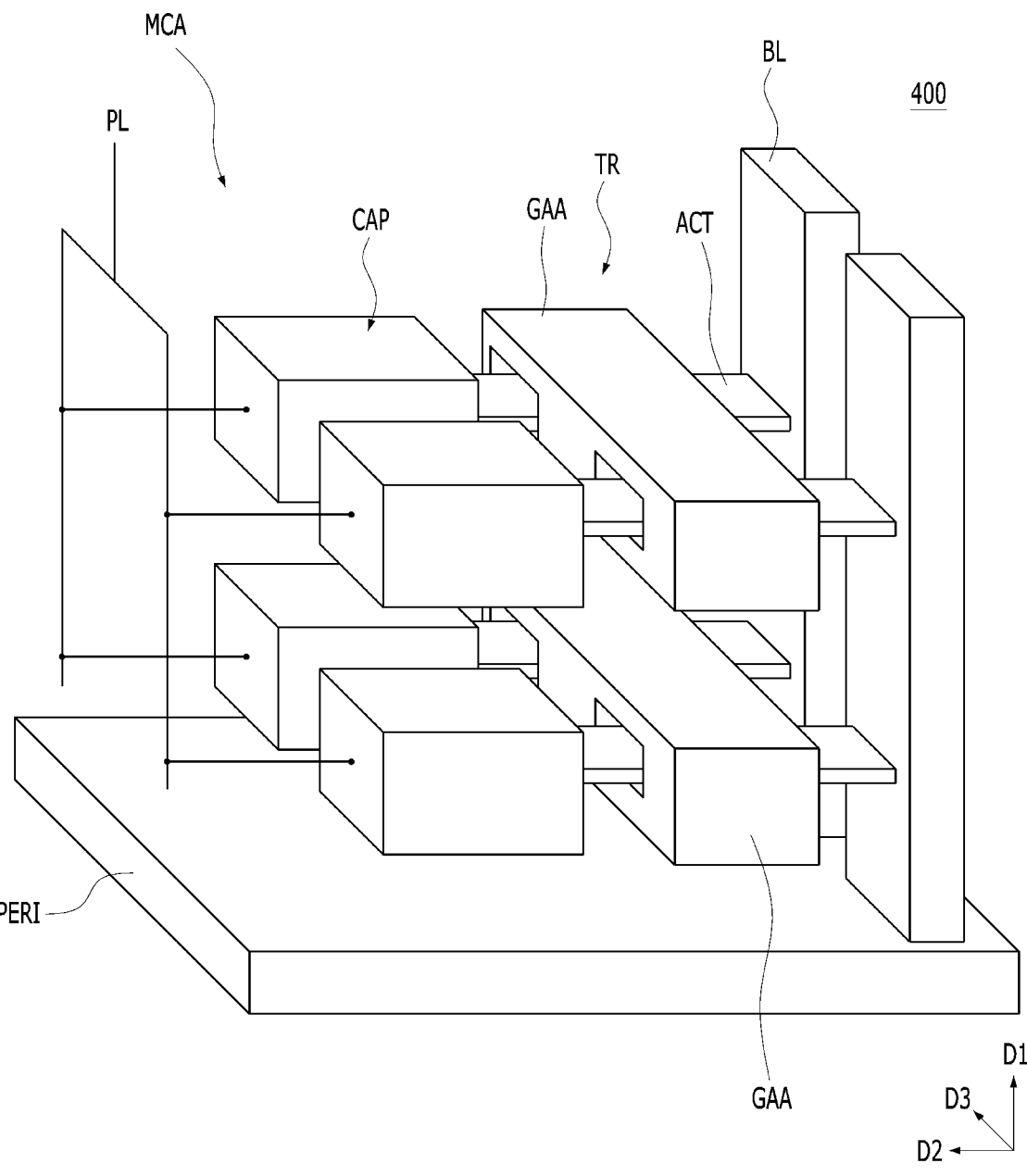
FIG. 8 is a schematic perspective view illustrating a semiconductor memory device according to another embodiment of the present invention.

FIG. 8 is a schematic perspective view of a semiconductor memory device according to another embodiment of the present invention. In FIG. 8, detailed descriptions of duplicate components with those of FIG. 3A will be omitted.

Referring to FIG. 8, the semiconductor memory device 400 may include a memory cell array MCA. The memory cell array MCA may be an array of a plurality of memory cells.

Each memory cell of the memory cell array MCA may include a bit line BL, a transistor TR, and a capacitor CAP. The transistor TR may include an active layer ACT and a gate all around type word line GAA. The bit line BL may have a pillar shape extending in the first direction D1. The active layer ACT may have a bar shape extending in the second direction D2 crossing the first direction D1. The gate all-around type word line GAA may have a line shape extending in the third direction D3 crossing the first direction D1 and the second direction D2. The capacitors CAP may be connected to the plate line PL.

The gate all-around type word line GAA may extend in the third direction D3 while surrounding the active layers ACT.

The plate node PN of the capacitor in FIGS. 7 and 8 may have the same structure as referenced in FIGS. 3B, 3C, and 6.

According to the above-described embodiments, since the plate nodes of horizontally adjacent capacitors are spaced apart from each other, the storage nodes of the capacitors may be formed to be stable, and thus capacitance of the capacitors may be increased.

The present invention described above is not limited by the above-described embodiments and the accompanying drawings, and it will be apparent to those skilled in the art that various substitutions, changes, and modifications may be made without departing from the spirit and scope of the present invention disclosure as defined in the following claims.

What is claimed is:

1. A semiconductor memory device, comprising:
a memory cell array including a plurality of memory cells over a substrate, the plurality of memory cells repeatedly arranged in a horizontal direction and a vertical direction, the horizontal direction parallel to a surface of the substrate, the vertical direction perpendicular to the surface of the substrate;
a plurality of bit lines, each bit line coupled to some of the plurality of memory cells which are stacked and arranged in the vertical direction over the substrate; and
a plurality of word lines, each word line coupled to some of the plurality of memory cells arranged in the horizontal direction over the substrate,
wherein each memory cell comprises a capacitor and an active layer which are arranged in the horizontal direction over the substrate, the active layer coupled to the word line and the bit line,
wherein the capacitor comprises a bident-shaped storage node coupled to the active layer and a trident-shaped plate node coupled to a plate line arranged in the vertical direction over substrate,
wherein the bident-shaped storage node and the trident-shaped plate node are horizontally arranged over the substrate to interlock with each other, and
wherein the plate line is coupled to plate nodes of plural capacitors of plural memory cells arranged in the horizontal direction and the vertical direction.

2. The semiconductor memory device of claim 1, further including a capacitor isolation layer, the capacitor isolation layer being formed between the plate nodes of the capacitors of the row array.

3. The semiconductor memory device of claim 1, wherein the bident-shaped storage node further comprises a cylindrical storage node, and
wherein the bident-shaped storage node and the trident-shaped plate node face each other with a dielectric layer interposed therebetween.

4. The semiconductor memory device of claim 1, further comprising:
contact plugs connected to the plate nodes, respectively; and
a common plate line connected to the contact plugs.

5. The semiconductor memory device of claim 1, wherein the bident-shaped storage node of the capacitor is spaced apart from that of another capacitor in the horizontal direction and the vertical direction.

6. The semiconductor memory device of claim 1,
wherein the active layer comprises a channel, the channel being parallel to the surface of the substrate, and
wherein the channel includes a thin-body channel thinner than the word line.

7. The semiconductor memory device of claim 6, wherein the word line includes a first word line and a second word line, the first word line and the second word line facing each other with the thin-body channel interposed therebetween.

8. The semiconductor memory device of claim 6,
wherein the word line includes a single word line or a gate all around word line,
wherein the single word line is disposed on an upper surface or a lower surface of the thin-body channel, and
wherein the gate of all around word line surrounds the thin-body channel.

9. The semiconductor memory device of claim 6, wherein the channel includes a semiconductor material or an oxide semiconductor material.

10. The semiconductor memory device of claim 6, wherein the channel includes polysilicon, germanium, silicon-germanium, or IGZO (Indium Gallium Zinc Oxide).

11. The semiconductor memory device of claim 1, wherein the memory cells include a Dynamic Random-Access Memory (DRAM) cell.

12. The semiconductor memory device of claim 1, further including a peripheral circuit for controlling the memory cells of the memory cell array.

13. The semiconductor memory device of claim 12,
wherein the peripheral circuit is disposed at a lower level than the memory cell array, or
wherein the peripheral circuit is disposed at a higher level than the memory cell array.

14. The semiconductor memory device of claim 1, wherein each of the trident-shaped plate nodes of the capacitors comprises:
an inner node disposed inside the storage node;
outer nodes disposed between the storage nodes of the capacitors arranged along the horizontal direction; and
a body node disposed between the outer nodes and connected to the inner node.

15. The semiconductor memory device of claim 1,
wherein the bit line is vertically oriented in the vertical direction, and
wherein the word line is horizontally oriented in the horizontal direction.

16. A semiconductor device, comprising:
a plurality of memory cells, each memory cell comprising an active layer and a capacitor;
a word line arranged in a horizontal direction over a substrate; and
a bit line arranged in a vertical direction over a substrate, the active layer coupled to the word line and the bit line; and
a plate line arranged in the vertical direction over the substrate,
wherein the memory cells are arranged between the bit line and the plate line in the horizontal direction and the vertical direction over the substrate,
wherein the capacitor comprises a bident-shaped storage node, a trident-shaped plate node, and a dielectric layer between the bident-shaped storage node and the trident-shaped plate node coupled to the plate line, and
wherein the bident-shaped storage node and the trident-shaped plate node are horizontally arranged over the substrate to interlock with each other.

17. The semiconductor device of claim 16, further including a capacitor isolation layer, the capacitor isolation layer being formed between the trident-shaped plate nodes of the capacitors of the row array arranged along the horizontal direction.

18. The semiconductor device of claim 16, wherein the bident-shaped storage node further comprises a cylindrical storage node, and wherein the bident-shaped storage node and the trident-shaped plate node face each other with a dielectric layer interposed therebetween.

19. The semiconductor device of claim 16, further comprising:

a plurality of contact plugs connected to the trident-shaped plate nodes, respectively; and a common plate line connected to the plurality of contact plugs.

20. The semiconductor device of claim 16, wherein the bident-shaped storage node of the capacitor is spaced apart from that of another capacitor in the horizontal direction and the vertical direction.

\* \* \* \* \*